United States Patent [19]

Butt

[11] Patent Number: 4,839,716
[45] Date of Patent: Jun. 13, 1989

[54] SEMICONDUCTOR PACKAGING

[75] Inventor: Sheldon H. Butt, Godfrey, Ill.

[73] Assignee: Olin Corporation, New Haven, Conn.

[21] Appl. No.: 56,624

[22] Filed: Jun. 1, 1987

[51] Int. Cl.[4] .................. H01L 23/02; H01L 23/08; H01L 23/48

[52] U.S. Cl. .......................... 357/74; 357/73; 357/84

[58] Field of Search .............. 357/73, 72, 74, 80, 357/84; 174/52 FP; 361/393, 394, 404, 405, 406, 421

[56] References Cited

U.S. PATENT DOCUMENTS

| | | | |
|---|---|---|---|
| 3,676,292 | 7/1972 | Pryor et al. | 161/196 |
| 3,726,987 | 4/1973 | Pryor et al. | 174/50.61 |
| 3,728,177 | 4/1973 | Caule | 156/3 |
| 3,946,428 | 3/1976 | Anazawa et al. | 357/84 |
| 4,149,910 | 4/1979 | Popplewell | 148/6.35 |
| 4,323,405 | 4/1982 | Uno et al. | 357/84 |
| 4,330,599 | 5/1982 | Winter et al. | 428/675 |
| 4,362,262 | 12/1982 | Winter et al. | 228/117 |
| 4,410,927 | 10/1983 | Butt | 361/386 |
| 4,429,022 | 1/1984 | Breedis et al. | 428/675 |
| 4,461,924 | 7/1984 | Butt | 174/52 FP |
| 4,480,262 | 10/1984 | Butt | 357/74 |
| 4,491,622 | 1/1985 | Butt | 428/632 |
| 4,498,121 | 2/1985 | Breedis et al. | 361/411 |
| 4,500,028 | 2/1985 | Breedis et al. | 228/117 |
| 4,500,605 | 2/1985 | Fister et al. | 428/469 |
| 4,521,469 | 6/1985 | Butt et al. | 428/35 |
| 4,524,238 | 6/1985 | Butt | 174/52 FP |
| 4,525,422 | 6/1985 | Butt et al. | 428/418 |
| 4,532,222 | 7/1985 | Butt | 501/22 |
| 4,542,259 | 9/1985 | Butt | 174/52 FP |
| 4,569,692 | 2/1986 | Butt | 75/235 |
| 4,570,337 | 2/1986 | Butt | 29/840 |
| 4,577,056 | 3/1986 | Butt | 174/52 FP |
| 4,594,770 | 6/1986 | Butt | 29/588 |
| 4,607,276 | 8/1986 | Butt | 357/79 |
| 4,625,400 | 12/1986 | Fister | 29/879 |
| 4,649,083 | 3/1987 | Fister et al. | 428/469 |
| 4,656,499 | 4/1987 | Butt | 357/74 |
| 4,659,404 | 4/1987 | Butt | 156/62.2 |
| 4,704,626 | 11/1987 | Mahulikar et al. | 357/74 |

FOREIGN PATENT DOCUMENTS

| | | | |
|---|---|---|---|
| 0103452 | 8/1981 | Japan | 357/74 |
| 0165341 | 12/1981 | Japan | 357/84 |
| 0039557 | 3/1982 | Japan | 357/84 |
| 0063850 | 4/1982 | Japan | 357/74 |
| 0110062 | 6/1983 | Japan | 357/84 |
| 0086852 | 5/1985 | Japan | 357/74 |

Primary Examiner—Andrew J. James
Assistant Examiner—Sheila V. Clark
Attorney, Agent, or Firm—Gregory S. Rosenblatt; Paul Weinstein

[57] ABSTRACT

A semiconductor package of the small outlined integrated circuit type is disclosed having an angled glass sealing surface. Another aspect of the invention relates to a shield disposed in a semiconductor package to prevent alpha radiation emitted from the sealing glass or other packaging components from impinging on the housed semiconductor device.

22 Claims, 2 Drawing Sheets

SEMICONDUCTOR PACKAGING

While the invention is subject to a wide range of applications, it is particularly suited to form semiconductor packages and will be particularly described in that connection. In particular, the semiconductor packages are of the small outlined integrated circuit type. Another aspect of the present invention is to provide semiconductor packages which prevent direct exposure of the packaged semiconductor device to alpha radiation being emitted from sealing glass or the packaging components manufactured with ceramic or glass constituents.

Presently, there are two conflicting trends in the semiconductor industry. One is the trend towards larger semiconductor die size and the other trend is to increase functional component density on printed circuit boards. The former trend requires increased area within the package for mounting and interconnecting the dies. The latter trend requires reducing the outside dimensions of the package. More specifically, the drive is to reduce the package "footprint" i.e., the area on the printed circuit board required to mount the package. A related trend is the development of surface mounted packages which conserve circuit board space by limiting the area occupied by the package to an outer surface layer of the board. This trend is in contrast to insertion mounted packages which preempt space through the entire thickness of multilayer printed circuit boards.

New packages have been developed within the electronics industry to satisfy the requirement for greater functional density. These include SOIC (small outline integrated circuit) packages which, in effect are DIP (dual-in-line) packages in which lead spacing has been reduced from the prevalent 0.100" to 0.050" or even to 0.040" between leads. Moreover, the width of the package has been reduced to less than the 0.200" dimension which is typical of standard, narrow body DIPs. In a similar vein, four sided packages with close lead spacing have been developed. These include leadless ceramic chip carriers, leaded ceramic chip carriers and leaded plastic chip carriers.

The extent to which the width of SOIC packages can be reduced has been limited by (a) the width required to accomodate interconnections between the die and the leadframe and (b) by the minimum width of the seal along the long edges of the package. This is particularly a problem in the case of hermetic packages. Typically, the minimum tolerable seal width in a glass sealed package is 0.050" on each side of the package. The minimum length of exposed internal lead required for wire bonding is 0.015". Thus, of the total SOIC package width, a total of 0.130" must be reserved for interconnections and for sealing. In the case of the SOIC configuration, the remaining width is so small that the glass sealed hermetic packages will be limited, for all practical purposes, to very small semiconductor dies. Accordingly, SOIC configured packages are not considered to be practical and are not in regular use in the electronics industry. Smaller packages also magnify the problems of heat dissipation because an equal amount of heat must be dissipated from a reduced surface area as compared to the surface area of the older style, larger packages.

It is a purpose of this invention to provide a glass sealed, metal SOIC package requiring a reduced sealing width and having improved thermal dissipation characteristics.

Another aspect of the present invention relates to a solutions of the increasingly important problem of exposure of semiconductor dies to alpha radiation. Although the high mass, alpha particles have little penetrating power, they do have the ability to alter the charge characteristics existing in individual cells on the face of semiconductor devices. As the cell size decreases to increase functional density of the semiconductor devices, the probability that a single alpha particle impact upon a cell will result in a "soft error", becomes increasingly great.

Residual radioactivity emanating from impurities in the materials from which both the conventional ceramics and the conventional sealing glasses are manufactured results in these components being sources of alpha radiation. This is particularly the case in the materials which form the sealing glasses. Manufacturers of the ceramic components and of the sealing glasses have exerted significant effort to purify their materials so as to minimize alpha radiation. Although alpha radiation has been reduced by these efforts, it has not been eliminated, and the best of the ceramic components and the sealing glasses presently available still emit significant alpha radiation.

It is a problem underlying the present invention to construct a glass sealed, SOIC semiconductor package wherein the width of the edges of the package required for glass sealing are reduced as compared to conventional glass sealed metal packages.

It is another problem underlying the present invention to manufacture a glass sealed, semiconductor package wherein alpha radiation emitted from the sealing glass does not directly impinge upon the face of the semiconductor device encased within the package.

It is an advantage of the present invention to provide a glass sealed metal package which obviates one or more of the limitations and disadvantages of the described prior arrangements.

It is a further object of the present invention to construct a glass sealed, SOIC semiconductor package wherein the sealing surfaces are angled with respect to the external surface of the base component.

It is a still further advantage of the present invention to provide a glass sealed, SOIC semiconductor package incorporating two leadframes.

It is a yet further advantage of the present invention to provide a hermetically sealed semiconductor package incorporating a seal ring with a glass sealing surface being angled with respect to the external surface of the base component.

It is another advantage of the present invention to provide a hermetically sealed, semiconductor package including shield means to prevent alpha radiation emitted from the sealing glass from directly impinging upon the semiconductor device.

Accordingly, there is provided a semiconductor package comprising a base component with an internal surface, an external surface and a glass sealing base surface which extends from a corner of the package to the interior of the package at an angle of about 20° to about 80° with respect to the external surface of the base component. A lid component is stacked on the base component to form a cavity adapted to receive a semiconductor device. The lid component has an internal surface, an external surface and a glass sealing lid surface which extends from the corner of the package to the interior of the package. The glass sealing lid surface is angled to be substantially parallel to the glass sealing base surface when the lid component is stacked on the base component. A leadframe is disposed between the glass sealing base and the lid surfaces. A sealing glass disposed between and bonded to the glass sealing base and lid surfaces hermetically seals the semiconductor package.

The present invention also relates to a hermetically sealed, semiconductor casing comprising a base component and a lid component stacked on the base component to form an enclosure adapted to house a semiconductor device. A leadframe is disposed between the base and lid components. A sealing glass disposed between the base component and the sealing component hermetically seals the semiconductor casing. Shield structure disposed within the enclosure deflects the path of alpha radiation emitted from the sealing glass to reduce the soft error effect from alpha radiation impinging on an enclosed semiconductor device.

IN THE DRAWINGS

The invention and further developments of the invention are now illustrated by means of preferred embodiments shown in the drawings.

Figure 1:
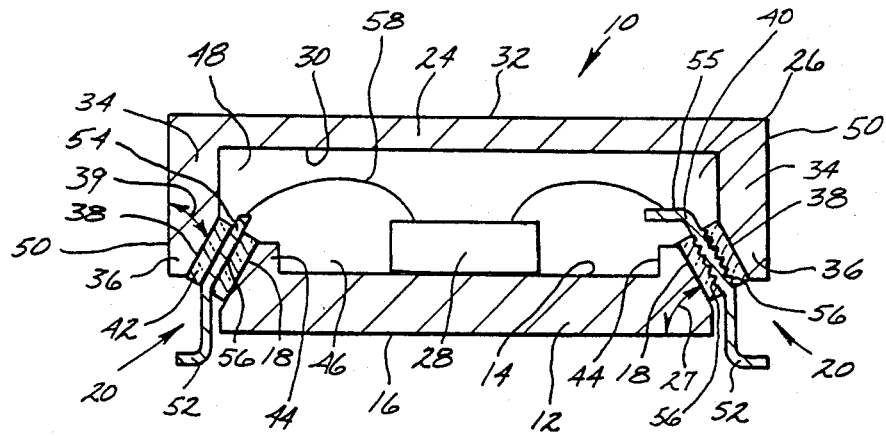
FIG. 1 is a cross-section of a hermetically sealed, semiconductor casing in accordance with the present invention.

Referring to FIG. 1, there is illustrated a hermetically sealed, semiconductor package 10. The package 10 includes a base component 12 having an internal surface 14, an external surface 16 and a glass sealing base surface 18. The glass sealing base surface 18 extends from the corners 20 of the package 10 to the enclosure or interior cavity 26 at a first angle 27 of about 20° to about 80° with respect to the external surface 16 of the base component 12. A lid component 24 is stacked on the base component 12 to form a cavity 26 which is adapted to house a semiconductor device 28. The lid component 24 has an internal surface 30, an external surface 32 and side walls 34 projecting outward and substantially perpendicular to the internal surface 30. The lower ends 36 of the side walls 34 each have a glass sealing lid surface 38 which extends from the corner 20 of the package 10 to the interior chamber 26. The glass sealing lid surface 38 forms a second angle 39 whereby surface 38 is substantially parallel to the glass sealing base surface 18 when the lid component 24 is stacked on the base component 12. A leadframe 40 is disposed between the glass sealing base surface 18 and the glass sealing lid surface 38. Moreover, a sealing glass 42 is disposed between and bonded to the glass sealing base surface 18 and the glass sealing lid surface 38 for hermetically sealing the semiconductor package 10.

Referring again to FIG. 1, the base component 12 is preferably formed with external walls 44 projecting upward from the internal surface 14 so as to form a recess 46 in which the semiconductor device 28 is disposed. A portion of the outer edge surface of the projecting walls 44 form the glass sealing base surface 18. The glass sealing base surface 18 projects at an angle 27 of about 20° to about 80° with respect to the external surface 16 of the base component 12. Preferably, the angle 27 is about 40° to about 70° and more preferably, the angle 27 to about 60°.

The lid component 24 has an external surface 32, an internal surface 30 and side walls 34 which project outward and substantially perpendicular from the surface 30 to form a recess 48 in the lid 24. The ends 36 of the side walls 34 include a glass sealing lid surface 38 which is cut at an angle 39 of about 20° to about 80° with respect to the outer surface 50 of walls 34. Preferably, the angle 39 is from about 40° to about 70° and more preferably about 60°. The underlying consideration in selecting the angle 39 is that when the lid 24 is stacked onto the base 12, the glass sealing lid surface 38 and the glass sealing base surface 18 are substantially parallel to each other. A further discussion of the selection of the angles 27 and 30 follow herein.

A leadframe 40 is disposed between the glass sealing base and lid surfaces 18 and 38, respectively. The leadframe 40 is illustrated with a gull wing design at its outer ends 52. Note that the ends 52 preferably do not project beyond the outer surfaces 50 of the walls 34. Thus, the "footprint" of the package 10 does not extend beyond the length of the package as illustrated. It is also within the terms of the present invention to shape the ends of the leadframe 40 into any desired configuration such as straight down to project into a hole within a circuit board, or inward towards the center of the external surface 16. The inner ends 54 and 55 of the leadframe 40 project into chamber 26. End 54 is illustrated as being coined while end 55 is illustrated as being bent. It is however, within the terms of the present invention, to shape the inner ends 54 and 55 into any desired shape.

A sealing glass 42 is disposed between and bonded to the glass sealing base 18 and lid 38 surfaces for hermetically sealing the semiconductor package 10. The sealing glass 42 may be selected from any desirable formulation which is able to adequately bond to both the surfaces 18 and 38 of the base and lid components 12 and 24, respectively. In addition, the glass must be able to bond to sealing surfaces 56 which are defined herein as being the opposite surfaces on the leadframe 40 to which the sealing glass 42 is bonded. Suitable sealing glasses are disclosed in U.S. patent application Ser. No. 26,701, entitled "Sealing Glass Composite" by E. F. Smith, III et al. and in U.S. patent application Ser. No. 27,069 entitled "Sealing Glass Composite", by E. F. Smith, III.

Although the glasses disclosed in the previously mentioned patent applications are preferred, it is within the terms of the present invention to use any other sealing glass as desired. Moreover, although a glass seal is preferred, it is also within the terms of the present invention to substitute any other sealing material such as a polymer resin for glass 42.

In forming the glass seal, a coating of glass may be applied to the glass sealing base surface 18 and to the glass sealing lid surface 38. Then, the base 12 and the lid 24 may be heated to form a glaze of the glass 42 on the surfaces 18 and 38 to which it was applied. Then, the leadframe 40 may be placed on the glazed surface 18 and the assembly is heated to sink the leadframe 40 into the glazed sealing glass 42. Subsequent to this step, the semiconductor device 28 is attached to the surface 14 of the base 12 using any desired means such as the semiconductor attachment materials described in U.S. patent application Ser. No. 826,808 entitled "Semiconductor Die Attach System", by M. J. Pryor et al. Then, the semiconductor die 28 is electrically connected to the leadframe 40 with bonding wires 58. The lid 24 is stacked onto the base component 12 and the components are heated to the sealing temperature of above about 400° for the required amount of time. Once the sealing glass 42 is in the molten state, the lid 24 and the base 12 are pressed together to squeeze the sealing glass 42 between the glass sealing base and lid surfaces 18 and 38, respectively, to form a substantially void free glass seal to hermetically seal the semiconductor package 10.

The advantages resulted by angling the glass seal areas is very practical with metal base and lid components 12 and 24, respectively which are machinable. The seal angles 27 and 39 are preferrably selected to be about 60°. However, a range of angles, as disclosed herein, may be used. The interaction between the glass sealing base and lid surfaces 18 and 38 causes a wedging effect so that gravity or external pressure applied to the cover 24 during the sealing step squeezes the glass 42 and causes it to flow. The result is an essentially void free glass seal. This is very important in forming a hermetically sealed package. It can be understood, that a vertical seal is not satisfactory because no pressure is transmitted to the seal area while the glass is in the plastic condition and a void free seal cannot be assured. Although angles 27 and 39 are considered to be optimum at about 60°, angles as great as 80° might be used in specific circumstances. Keeping in mind that the size of the sealing surface must be adequate, angles of less than 60° may also be used but result in a package.

Due to the mating wedge configuration of the glass sealing base surface 18 to the glass sealing lid surface 38, adequate structural stiffness is obtained in the unusually low profile package illustrated in FIG. 1. Although the configuration as illustrated in FIG. 1 represents a transverse cross-section of a dual-in-line package, it is also within the terms of the present invention for this configuration to represent a cross-section of a four-sided, leaded chip carrier. The reduction in the dimensions as explained with respect to the dual-in-line packages are generally applied in the same way to four-sided chip carriers.

Note that in FIG. 1, the internal lead tip 54 has been coined so that the surface exposed for wire bonding is parallel to the plane through the top surface of the chip 28. This is intended to facilitate wire bonding and to increase the lead tip area available for wire bonding. However, if desired, the lead tips may be coined to any other desired configuration or cut off square.

As explained hereinbefore, the pressure applied during the sealing of the lid 24 to the base 12 results in the application of a shear stress on the bond between the leads of leadframe 40 and the sealing glass 42. The shear strength of the bond may be enhanced by stamping a knurl or other pattern into the glass sealing surface 56 on the leadframe 40. Although any pattern may be used, a knurl pattern is considered optimum since it provides reinforcement both longitudinally and laterally to the glass bond. Moreover, the length of the sealing surface 56 on the leadframe 40 which is embedded in the sealing glass 42 may vary to provide additional reinforcement of the glass bond.

The base 12, lid 24 and leadframe 40 are constructed of any desirable metal or alloy. Preferably, the preferred metal for fabricating components of this invention is a thermally stable, glass sealable alloy such as a Cu-Ni-Al alloy as disclosed in U.S. patent application No. 710,777 to Pryor et al. Advantages of this particular type of alloy is also described in U.S. patent application Ser. No. 2,532, entitled "Process For Producing Formable And High Strength Leadframes For Semiconductor Packages", by Mahulikar et al. Other materials suitable for forming the semiconductor package components, other than the leadframe, include any material selected from the group consisting of metals, alloys, ceramics, cermets, ceramic-glass and ceramic-glass-metal composites and combinations thereof which can effectively bond to the sealing glass. For example, high thermal conductivity metals and alloys such as copper, iron, aluminum, nickel and alloys thereof may be used in constructing a package. Another possible metal or alloy includes a copper or copper base alloy which has a low oxidation rate and/or is capable of forming a thin refractory oxide layer on at least the surface bonded to the sealing glass.

Figure 2:
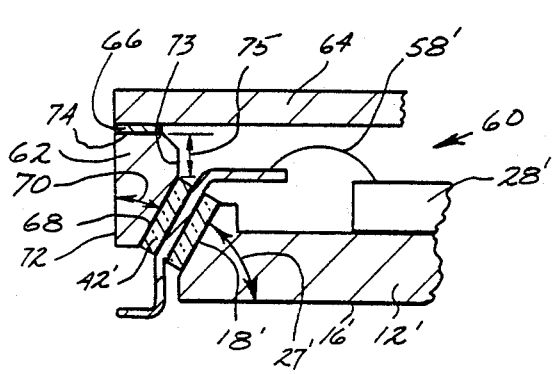
FIG. 2 is a cross-sectional view of a portion of a hermetically sealed, semiconductor casing including a seal ring in accordance with the present invention.

Referring to FIG. 2, there is illustrated a second embodiment of the present invention wherein a package 60, a partial section of which is illustrated, includes a seal ring 62 which is both glass sealed to a base component 12' and sealed to a lid component 64. Reference numerals which are primed designate components which are essentially identical to the components designated by the unprimed reference numerals described herein. The advantage of the seal ring 62 is that it can be glass sealed with a sealing glass 42' to a base component 12' prior to the attachment of a semiconductor device 28' to the base component 12'. Then, a lower temperature sealing material 66, such as for example, solder or a polymer resin adhesive may be used to attach the lid 64 to the seal ring 62.

The seal ring 62, which is preferably formed of the same material as the base component 12', includes a glass sealing seal ring surface 68 which forms a third angle 70 with an outer surface 72 of the ring 62. The angle 70 is selected so that surface 68 is essentially parallel with the glass sealing base surface 18' when the seal ring 62 is glass bonded to the base component 12'. The angle 70 has the same limits imposed as explained with respect to the angle 39 described hereinbefore. As described hereinbefore, the glass sealing base surface 18' forms a fourth angle 27' with the base surface 16'.

The seal ring 62 also includes a ring sealing surface 74 which is bonded to the lid 64. The lid 64 may be formed of any desired material as described hereinbefore regarding the selection of material for the components of the package 10. The advantage of this configuration is that the lid component 64 may be a flat, unmachined metal component. However, since the seal ring 62 requires enough height so as to provide a clearance for the bonding wire 58', a limitation as to the width of the wire bonding machine is imposed. The wire bonding machine must be able to be inserted between the inner surfaces 73 of the seal ring 62.

Figure 3:
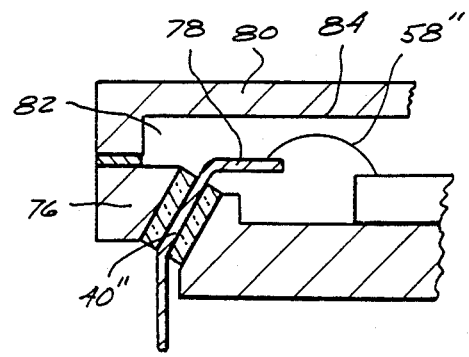
FIG. 3 is a cross-sectional view of a portion of a hermetically sealed, semiconductor casing incorporating a seal ring as illustrated in FIG. 2 except the lid has a cavity formed therein.

To overcome this problem, a seal ring design is illustrated in FIG. 3 where the seal ring 76 is machined down so as to not protrude over the top surface 78 of the leadframe 40". In order to accomodate the height of the lead wires 58", the lid component 80 is formed with a recess 82 which is sized to prevent the inner surface 84 of the lid component 80 from contacting the lead wires 58".

A further embodiment of the present invention is directed to a hermetically sealed semiconductor package 90 including a seal ring 92 which is formed of at least first and second sections 94 and 96, respectively. The first section 94 includes a first section seal surface 98 which is substantially parallel with the glass sealing base surface 18''' of the base component 12'''. The fifth angle 100 varies between about 20° and about 80° and is preferably about 60° as explained hereinbefore with regards to the angle 39. A leadframe 40''' is sealed with a glass 42''' between the base component 12''' and the first section 94 of the seal ring 92. The first section 94 also includes a sealing surface 102 which may be formed at an angle 104 selected from between about 20° to about 60° with respect to a surface 106 which extends substantially perpendicular to the bottom surface 108 of the first section 94. Angle 104 may be slightly smaller than angle 100 in order that the end 111 of leadframe 110 extends closer to the semiconductor chip 28''' whereby the length of the lead wires 112 is reduced.

The second section 96 of the seal ring 92 includes a second section bonding surface 112 which is substantially parallel to the bonding surface 102 of the first section 94. The angle 114 between the surface 112 and the end surface 116 of the second section 96 of the seal ring 92 is preferably from about 20° to about 80°.

Figure 4:
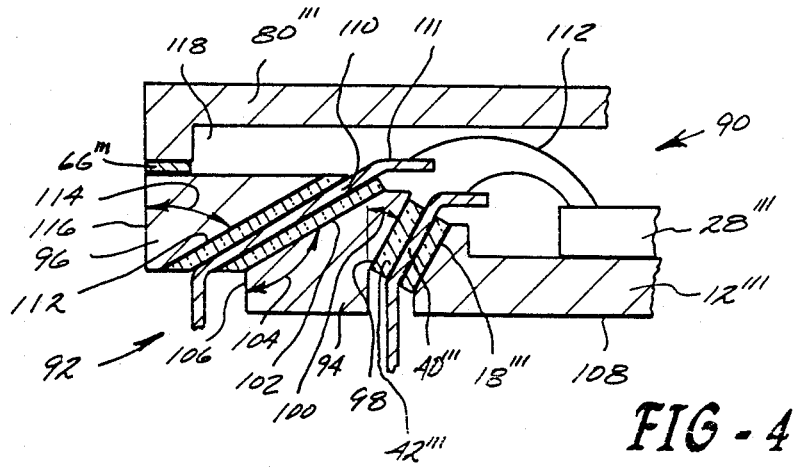
FIG. 4 is a cross-sectional view of a portion of a hermetically sealed, semiconductor casing having a seal ring adapted to accomodate two leadframes in accordance with the present invention.

As with the seal ring embodiments of FIGS. 2 and 3, a sealing material 66''' is disposed between the seal ring 92 and the lid 80'''. Moreover, the seal ring 92 may extend to above the top surface of the leadframe 110 so as to use a flat lid as illustrated in the embodiment of FIG. 2 or may be provided with a recess 118 as illustrated in FIG. 4 so as to allow clearance for the bonding wires 112.

The present invention also relates to the preventing of alpha radiation being emitted from the sealing glass to directly contacting the face of a semiconductor die. As explained hereinbefore, alpha radiation which impinges onto the surface of a semiconductor die can create a soft error. It is believed that copper alloys do not emit alpha radiation. Moreover, alpha radiation travels in a straight line from its source and is readily absorbed by the first solid target which it meets. Therefore, the provision of a shield between the source of the alpha radiation and the semiconductor die can result in the exposed surface of the packaged semiconductor die having no actual exposure to the alpha radiation emissions.

Figure 5:
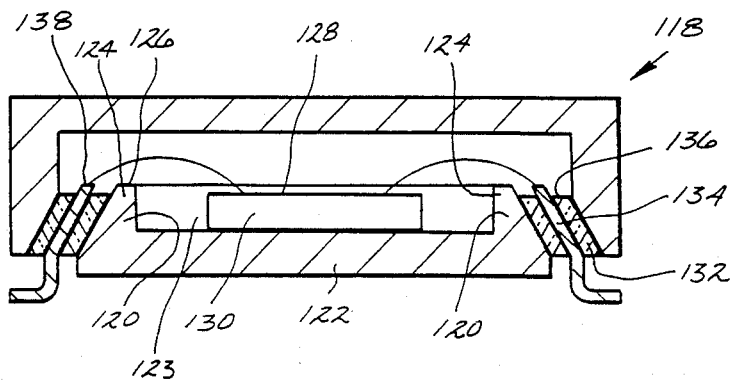
FIG. 5 is a cross-section of a hermetically sealed, semiconductor casing including a shield projecting into the enclosure of the casing to prevent direct impingement of alpha radiation on an enclosed semiconductor device in accordance with the present invention.

Referring to FIG. 5, there is illustrated a partial view of a semiconductor package 118 which is similar to that illustrated in FIG. 1. The only difference is that projecting wall 120 of the base component 122 which forms a recess containing a semiconductor device 130 includes a lip 124 which projects so that its upper surface 126 is above the upper surface 128 of the semiconductor die 130. Moreover, the sealing glass 132 which bonds the angled leadframe 134 into place has been lowered such that the upper surface 136 of the sealing glass 132 is below the upper surface 126 of the lip 124 of projecting wall 120.

As illustrated in FIG. 5, there is no direct line of sight path between the sealing glass 132 and the face 128 of die 130. The semiconductor package 118 is therefore characterized as one in which there is substantially zero exposure of the face 128 of die 130 to alpha radiation. The increase in the size of the projecting wall 120 results in the package 118 being slightly larger than package 10 as illustrated in FIG. 1. As illustrated in FIG. 5, the tip 138 of the lead 134 is slightly above the face 128 of the die 130. However, it is within the terms of the present invention to also form the tip 138 of the lead to be coplanar with the face 128 of die 130.

Figure 6:
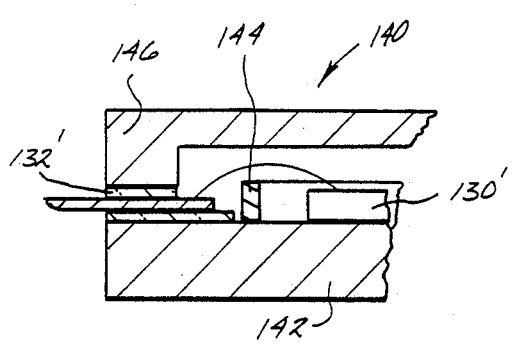
FIG. 6 illustrates a partial view of a glass sealed, semiconductor device having a ring within the glass sealed enclosure to prevent direct impingement of alpha radiation on the semiconductor device.

Referring to FIG. 6, there is illustrated a partial view of a package 140 which includes an alternative means of shielding a die 130' from alpha radiation being emitted from a sealing glass 132'. The flat base component 142 has a die 130' attached thereto and includes a radiation shield 144 between the die 130' and the sealing glass 132'. The radiation shield 144 may be formed of metal tubing. The tubing is preferably formed with a thin walled, cross-section which is substantially square or rectangular in shape. It is also within the term of the present invention to form the cross-section with any desired shape such as circular or oval. The radiation shield 144 may be attached to the base component 142 using any desired means such as welding or brazing. It is also within the terms of the present invention to machine the base component 142 to form the shield 144. The material for the shield 144 is preferably a metal or metal alloy. Moreover, the material used for the base and lid components 142 and 146 may also be of a metal or alloy as described hereinbefore with regards to the materials used to construct package 10.

Figure 7:
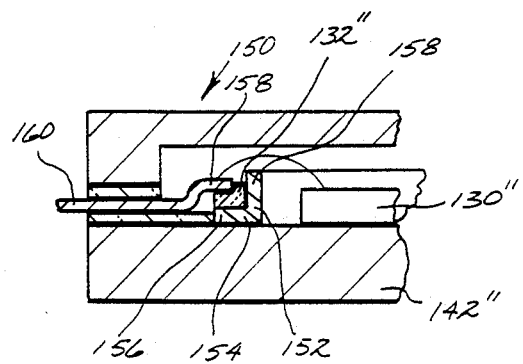
FIG. 7 illustrates a partial view of a hermetically sealed, semiconductor device including a shield ring to prevent direct impingement of alpha radiation on a semiconductor device.

Another embodiment of the present invention, as illustrated in FIG. 7 includes a package 150, shown as a partial view. A radiation shield 152 is formed in the shape of a flanged cup 154 having a base section 156 and an upstanding lip section 158 projecting substantially perpendicular to said base 156. The base 154 of the radiation shield 152 may be soldered or brazed onto the flat surface of base component 142". It is also within the terms of the present invention to machine the radiation barrier 152 into the flat base 142". The flanged cup 152 may be preglazed with solder glass 132" prior to its attachment to the base component 142". Glazing 132" supports the lead tips 158 of the inner end of leadframe 160. The lead tips 158 may be embedded in the glass 132". It is also within the terms of the invention for the lead tips 158 to rest on the glazing 132". The provision of the glazing is important to prevent the end 158 of the leadframe 160 from contacting the radiation shield and creating a short circuit into the base 142". Note that it is desirable to position the lead tip 158 substantially coplanar with the top surface of the semiconductor die 130".

Figure 8:
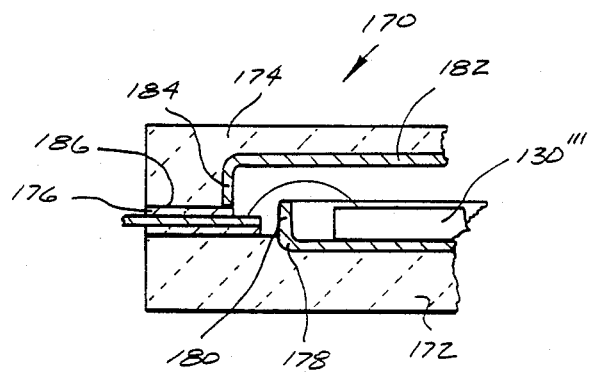
FIG. 8 illustrates a partial view of a hermetically sealed semiconductor casing formed of a ceramic type material and including cup shaped elements molded into the base and lid to prevent direct impingement of alpha radiation emission on the semiconductor device.

FIG. 8 illustrates another embodiment of shielding radiation emissions. A semiconductor package 170, illustrated as a partial view, includes radiation shielding from the base 172, the lid 174 and the sealing glass 176 so as to prevent direct impingement of alpha radiation being emitted from the glass 176 and the base and lid components 172 and 174, respectively, from impinging onto the die 130'''. The base and lid components 172 and 174, respectively, may be formed of materials form the group including ceramics, cermets, cerglass, ceramic-glass-metal composites and mixtures thereof. The ceramic-glass-metal composites are disclosed in U.S. patent application No. 924,968 entitled "Ceramic-Glass-Metal Composite". Glass and ceramic are disclosed in U.S. Pat. No. 4,715,892 entitled "Cermet Substrate With Glass Adhesion Component". Other materials are described in U.S. Pat. No. 4,569,692 entitled "Low Thermal Expansivity And High Thermal Conductivity Substrate" and in U.S. patent application Ser. No. 924,970 entitled "Improved Cerdip Process".

Since the ceramic and glass materials which may be used in forming the base and lid components 172 and 174 typically emit alpha radiation, it is required to shield these materials from the semiconductor die 130'''. A cup shaped component 178 is embedded into the base component 172. The wall 180 of the cup shaped component 178 extends above the sealing glass 176 and prevents a direct line of sight from the sealing glass 176 to the semiconductor device 130'''. A second cup shaped device 182 is embedded in the lid component 174 and has a wall 184 which extends to the sealing surface 186 of the lid component 174 and thereby prevents alpha radiation being emitted from the lid component 174 from impinging on the semiconductor die device 130'''. Although the cup components 178 and 182 are described as being embedded in the base and lid components 172 and 174 respectively, it is also within the terms of the present invention to affix them to the base and lid components 172 and 174, respectively, by any desired means such as with an adhesive like a polymer resin.

Whereas the semiconductor package has been described as having leads, it is also within the scope of the present invention to substitute a leadless chip carrier.

Whereas the disclosed packages are described as housing semiconductor devices, it is within the terms of the present invention for the packages to house any type of electrical or electronic device.

Whereas the semiconductor packages are typically constructed from metal or alloy components, it is also within the terms of the present invention to construct the packages from any desired material such as cermets, ceramics, glass-ceramics, ceramic-glass-metal composites and combinations thereof.

The patents and patent applications set forth in this application are intended to be incorporated in their entireties by reference herein.

It is apparent there has been provided in accordance with this invention a semiconductor casing and process of forming the casing which satisfies the objects, means and advantages set forth hereinbefore. While the invention has been described in combination with the embodiments thereof, it is evident that many alternatives, modifications and variations will be apparent to those skilled in the art in lgith of the foregoing description. Accordingly, it is intended to embrace all such alternatives, modifications, and variations as fall within the spirit and broad scope of the appended claims.

I claim:

1. A semiconductor package for housing a semiconductor device, comprising:
a base component having spaced parallel internal and external surfaces and a base sealing surface connected to said internal and external surfaces at the outer periphery thereof and at least a portion of said base sealing surface being formed at an angle of from about 20° to about 80° with the respect to said external surface;
a lid component stacked on said base component to form a cavity adapted to house a semiconductor device, said lid component having spaced parallel internal and external surfaces and a lid sealing surface connected to said internal and external surfaces at the outer periphery thereof and at least a portion of said lid sealing surface being formed at an angle of from about 20° to about 80° with respect to said external surface, said angle selected to be substantially parallel to said base sealing surface when said lid component is stacked on said base component;
a leadframe disposed between the base sealing surface and the lid sealing surface; and
sealing means disposed between and bonded to the base sealing surface and the lid sealing surface for sealing said semiconductor package.

2. The semiconductor package of claim 1 wherein said first and second angles are about 40° to about 70°.

3. The semiconductor package of claim 2 wherein said first and second angles are about 60°.

4. The semiconductor package of claim 2 wherein portions of the leadframe disposed between said base and lid glass sealing surfaces have a pattern formed thereon to enhance the bond strength between the sealing means and the leadframe.

5. The semiconductor package of claim 4 wherein said pattern is a knurl pattern.

6. The semiconductor package of claim 2 wherein said base and lid are formed of a metal or alloy.

7. The semiconductor package of claim 6 wherein said sealing means is selected from the group consisting of sealing glasses and polymer resin adhesives.

8. The semiconductor package of claim 7 wherein said sealing means is a sealing glass.

9. The semiconductor package of claim 6 wherein said sealing means is selected from the group consisting of sealing glasses and polymer resin adhesives.

10. The semiconductor package of claim 9 wherein an internal wall of said base component includes a lip, said lip projecting above said sealing glass to eliminate a direct line of sight path from said sealing glass to said semiconductor device.

11. A semiconductor package, comprising:
a base component having spaced parallel internal and external surfaces and a base sealing surface connected to said internal and external surfaces at the outer periphery thereof and at least a portion of said base sealing surface being formed at an angle of from about 20° to about 80° with respect to said external surface;
a seal ring stacked on said base component, said seal ring having a first surface for sealing to a lid component and a glass sealing seal ring surface which extends from said corner of said package to a cavity with said package, said glass sealing seal ring surface having a third angle whereby said glass sealing seal ring surface is substantially parallel to said glass sealing base surface when said seal ring is stacked on said base component;
a leadframe disposed between the glass sealing base and seal ring surfaces;
a sealing glass disposed between and bonded to the glass sealing base and glass sealing seal ring surfaces;

a lid component stacked onto and bonded to the first surface of the seal ring for hermetically sealing said semiconductor package.

12. The semiconductor package of claim 10 wherein said base sealing surface angle is about 40° to about 70°.

13. The semiconductor package of claim 12 wherein said base sealing surface angle is about 60°.

14. The semiconductor package of claim 13 wherein the portions of the leadframe disposed between said base and seal ring glass sealing surfaces have a pattern formed thereon to enhance the bond strength between the sealing glass and the leadframe.

15. The semiconductor package of claim 14 wherein said pattern is a knurl pattern.

16. The semiconductor package of claim 11 wherein said base, seal ring and lid are formed of a metal or alloy.

17. The semiconductor package of claim 16 wherein said lid component is bonded to said seal ring with a material selected from the group consisting of adhesives, solders and glasses.

18. The semiconductor package of claim 17 wherein said seal ring comprises a first seal ring component, said first seal ring component having a first surface comprising said glass sealing seal ring surface and a second glass sealing surface extending at an angle between about 20° to about 80° with respect to the bottom surface of the base component.

19. The semiconductor package of claim 18 wherein said seal ring further comprises a second seal ring component, said second seal ring component having a third surface comprising said first surface for sealing to a lid component and a fourth surface which is substantially parallel to said second glass sealing surface.

20. The semiconductor package of claim 19 further including a second leadframe disposed between said first seal ring component and said second seal ring component; and sealing glass disposed between said first and second seal ring components for bonding said first seal ring component to said second seal ring component.

21. A hermetically sealed semiconductor casing, comprising:

a base component;

a lid component stacked on said base component forming an enclosure adapted to house a semiconductor device;

a leadframe disposed between said base and lid components;

a sealing glass disposed between said base component and said lid component to hermetically seal said semiconductor casing;

a flanged cup affixed to said base component projecting above the height of said sealing glass located in said enclosure to deflect the path of alpha radiation emitted from said sealing glass whereby the soft error effect from alpha radiation impinging on a semiconductor device is reduced; and a sealing glass on said flanged cup for supporting the inner end of the leadframe.

22. The semiconductor casing of claim 21 wherein said base and lid components are constructed of metal or alloy.

* * * * *